United States Patent
Corniglion et al.

(10) Patent No.: US 6,726,959 B1
(45) Date of Patent: Apr. 27, 2004

(54) PROCESS FOR FABRICATING A COATING LAYER ON A PORTABLE SUPPORT, PARTICULARLY A CARD FORMAT SUPPORT, AND PORTABLE SUPPORT PROVIDED WITH SUCH COATING LAYER

(75) Inventors: Isabelle Corniglion, Auriol (FR); Christian Leriche, Trets (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/101,050

(22) PCT Filed: Dec. 30, 1996

(86) PCT No.: PCT/FR96/02105

§ 371 (c)(1),
(2), (4) Date: Nov. 12, 1998

(87) PCT Pub. No.: WO97/25689

PCT Pub. Date: Jul. 17, 1997

(30) Foreign Application Priority Data

Jan. 4, 1996 (FR) ............................................. 96 00059

(51) Int. Cl.⁷ .................................................. B05D 3/02
(52) U.S. Cl. .................... 427/372.2; 427/379; 427/382; 427/385.5; 427/386; 427/391
(58) Field of Search ................................. 428/500, 914, 428/915, 200, 207, 201; 283/112, 109, 74, 75, 77; 427/372.2, 379, 385.5, 382, 386, 391

(56) References Cited

U.S. PATENT DOCUMENTS

| | | | | | |
|---|---|---|---|---|---|
| 4,289,811 | A | * | 9/1981 | Shelley, Jr. | 427/239 |
| 4,368,237 | A | * | 1/1983 | Yamada et al. | 428/413 |
| 4,389,472 | A | * | 6/1983 | Neuhaus et al. | 430/10 |
| 4,906,498 | A | * | 3/1990 | Ichikawa et al. | 428/64 |
| 5,466,319 | A | * | 11/1995 | Zager et al. | 156/220 |
| 5,534,372 | A | * | 7/1996 | Koshizuka et al. | 430/10 |
| 5,565,501 | A | * | 10/1996 | Hosokawa et al. | 522/83 |
| 5,739,214 | A | * | 4/1998 | Schunck | 525/438 |
| 5,861,194 | A | * | 1/1999 | Noguchi et al. | 427/386 |
| 6,132,799 | A | * | 10/2000 | Corniglion et al. | 427/96 |

FOREIGN PATENT DOCUMENTS

| | | | |
|---|---|---|---|
| DE | 4344125 A1 | * | 6/1995 |
| EP | 0031521 | | 7/1981 |
| EP | 0636495 | | 2/1995 |
| JP | 57090789 A | * | 6/1982 |
| WO | WO-9517476 | * | 6/1995 |

* cited by examiner

Primary Examiner—Monique R. Jackson
(74) Attorney, Agent, or Firm—Roland Plottel; John D. Upham

(57) ABSTRACT

The invention relates to a process for fabricating a coating layer (8) and a portable support (1) provided with such layer, comprising a support body (3) provided on one of its sides (4) with said coating layer (8). The process of the invention is characterized in that, for the fabrication of the coating layer (8), a transient thermoplastic layer (17) is cross-linked so as to make it thermosettable. The invention applies particularly to the fabrication of chip based cards.

26 Claims, 2 Drawing Sheets

PROCESS FOR FABRICATING A COATING LAYER ON A PORTABLE SUPPORT, PARTICULARLY A CARD FORMAT SUPPORT, AND PORTABLE SUPPORT PROVIDED WITH SUCH COATING LAYER

This invention relates to a process for fabricating a coating layer on a portable support and to a support provided with such layer.

The portable supports concerned by the present invention are objects of normalized size which may be carried without difficulty by their owner, for example in a pocket. They particularly concern card format supports such as chip cards or badges whose most frequent use is holder identification, giving the latter rights such as access rights or rights to conduct various banking operations.

At the present time, these card format portable supports are normalized. The usual ISO 7810 standard determines a standard card size that is 85 mm long, 54 mm wide and 0.76 mm thick.

To fabricate a card of the prior art, first a card body is produced which is printed and covered with a thin, transparent layer of polymethylmethacrylate (PMMA) transferred from a transfer film.

In practice, transfer films are multilayer films formed by coating or lamination. They are made up of a support layer in polyethylene terephtalate (PET) having a surface varnish and separated from the coating layer by a detaching or releasing layer made up of an adhesive, for example polyvinylbutyrate (PVB) or products of similar type. Another layer or adhesion layer may be added to the coating layer to promote adhesion of said coating layer onto the support. In one example, this adhesion layer is a copolymer of polyvinyl chloride (PVC)/polyvinyl acetate chloride (PVAc) type.

When a film such as described above is applied to the surface of the card body, and is exposed to a source of heat from an electronic heating head for example, the detachment layer separates and the coating and adhesion layers adhere to the surface of the card, naturally, under the effect of heat.

After transfer, however, it is not possible to modify the characteristics of the coating layer.

Also, since the coating layer is thermoplastic, it has little or no cross-linkage, softens under heat and has little resistance to abrasion and some solvents.

The objective of the present invention is to provide a new process for fabricating a coating layer on a portable support and also a portable support provided with such layer, which remedy the above-mentioned disadvantages at low cost and which can be used in particular to obtain supports whose coating layer provides suitable adhesion and has improved resistance to heat, abrasion and solvents.

This objective, and others which will be seen below, is achieved through a stage comprising cross-linkage or post cross-linkage of a thermoplastic layer so as to make it thermosettable.

Under a first variant to implement one embodiment of the invention, a thermoplastic layer is deposited on the support and is then cross-linked to improve its characteristics, and under a second variant for the implementation of this embodiment a post cross-linked coating layer is made which is deposited on the support with a suitable adhesion layer.

The object of the invention, therefore, is a process for fabricating a portable support, particularly a card format support, comprising a support body provided, on one of its sides, with a coating layer, characterized in that to fabricate said coating layer:

a transient thermoplastic layer is cross-linked to make it thermosettable.

Also, the object of the invention is a portable support, particularly a support of card format, comprising a support body provided, on one of its sides, with a coating layer, characterized in that said coating layer is a post cross-linked, thermosetting a layer.

The following description, which is in no way restrictive, will give a better understanding of the manner in which the invention may be put into practice.

It should be read with reference to the appended drawings in which.

Figure 1:
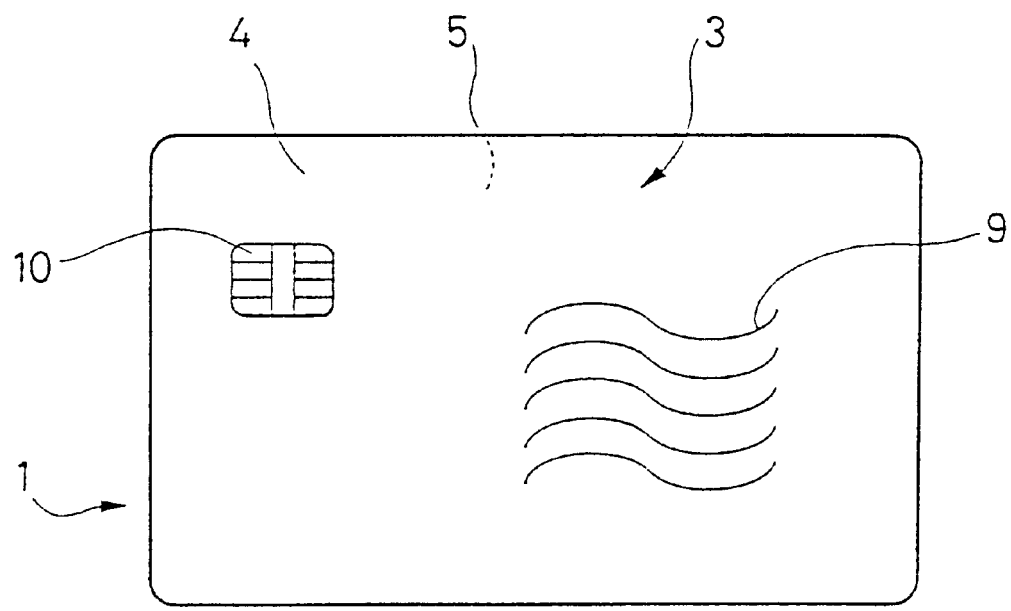
FIG. 1 shows, seen from above, a portable card format support of the invention.
Figure 2:
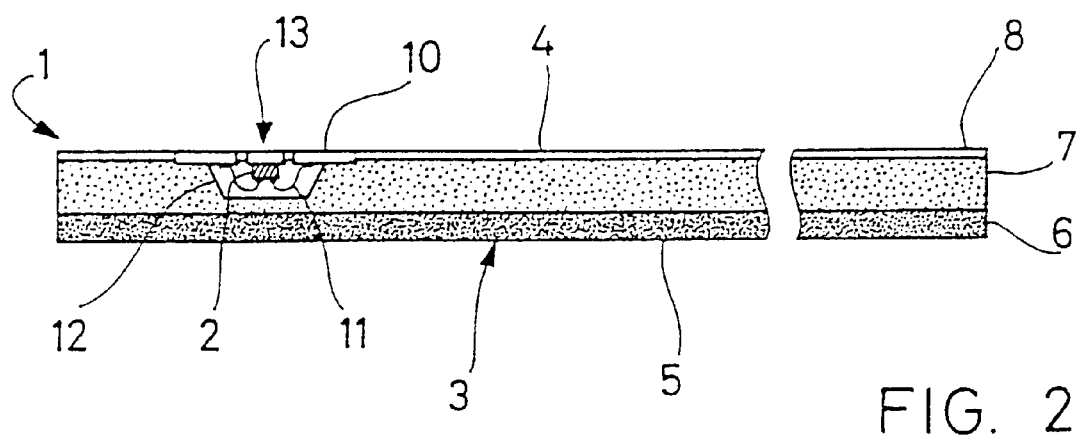
FIG. 2 shows a cross-section view of a card format support of the invention.

In the example of the present description, the portable support of the invention is a card 1 with a microcircuit or chip 2 comprising a card body 3.

Card body 3 forms a rectangular parallelepiped whose measurements are those of the above-mentioned ISO 7810 standard. It therefore has six sides of which two large sides approximately 85 mm long and 54 mm wide: a top side 4 and a bottom side 5.

It is made up of one or more layers of thicknesses, for example three, one lower layer 6, an intermediate layer 7 and a top or coating layer 8.

Layers 6, 7 are polymerized plastic layers made for example in acrylonitrile-butadiene-styrene (ABS), in polycarbonate (PC), in PET, in PVC, in PVC-PVAc copolymer or in a mixture of these compounds. However, any other, especially thermoplastic, material may be suitable if it gives the card body 3 the desired qualities of rigidity on bending, shock resistance, dimensional stability, colour and printability.

Coating layer 8 is part of the invention. It covers intermediate layer 7 of the card body 3, and it is normally between approximately 2 and 200 μm thick. However, if its thickness lies between 2 and 20 μm, it will be readily defined as a layer of protection, whereas if its thickness is between 20 and 200 μm, it is rather defined as a top layer of card body 3 or overlay. Obviously the above thicknesses are not restrictive, and 4 coating layer 8 can be considered having a thickness of approximately the thickness of the card, i.e. of about 800 μm.

Card body 3 is printed. It therefore has a print 9 visible on side 4 of card 1. Dyes which make up print 9 are contained either in coating layer 8, or in intermediate layer 7, the coating layer 8 in this case being transparent.

Card 1 of the invention has metallizations flush with side 4 of card body 3. These metallizations 10 are electrically connected by connector leads 11 to chip 2 of card body 3. The unit made up of chip 2 and connector leads 11 is coated in a resin 12 and, with metallizations 10, forms an electronic module 13.

For the fabrication of a portable card format support of the above type, first layers 6 and 7 of card body 3 and the electronic module 13 are assembled to obtain a unit made up of said layers 6, 7 and said electronic module 13.

This unit may be assembled by different means known to those skilled in the art, for example by colamination, moulding or overmoulding.

In the event of colamination, layers 6 and 7 are placed between two press plates. They are then welded by applying temperature and pressure stresses, and electronic module 13 is placed in a cavity after said cavity has been made in said welded layers 6, 7.

In the event of moulding or overmoulding, a liquid, plastic matter is injected or dispensed into a cavity of a mould having the size of the unit it is desired to obtain. However, for moulding, a cavity is made in moulded layers 6, 7 in which the electronic module 13 is placed, whereas for overmoulding, the electronic module 13 is inside the mould cavity at the time the liquid plastic is injected or dispensed.

As soon as the assembly of layers 6, 7 and of the electronic module 13 is made, the surface of said layer 7 can be printed and, according to a further stage of the invention, said surface 7 can be covered with coating layer 8.

Figure 3:
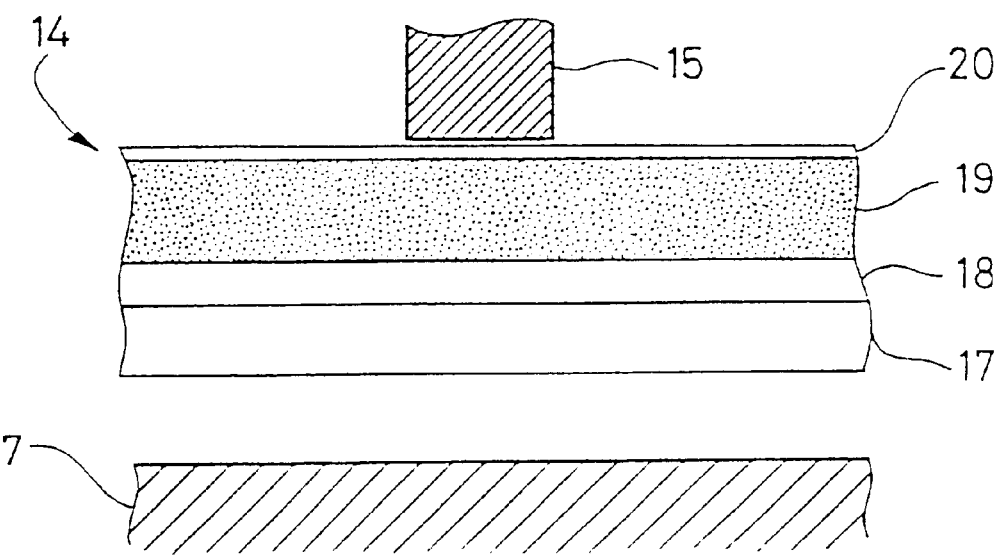
FIG. 3 illustrates, in cross-section, the transfer of a protection layer from a transfer film in accordance with a first variant implementing a first embodiment of the invention.
Figure 4:
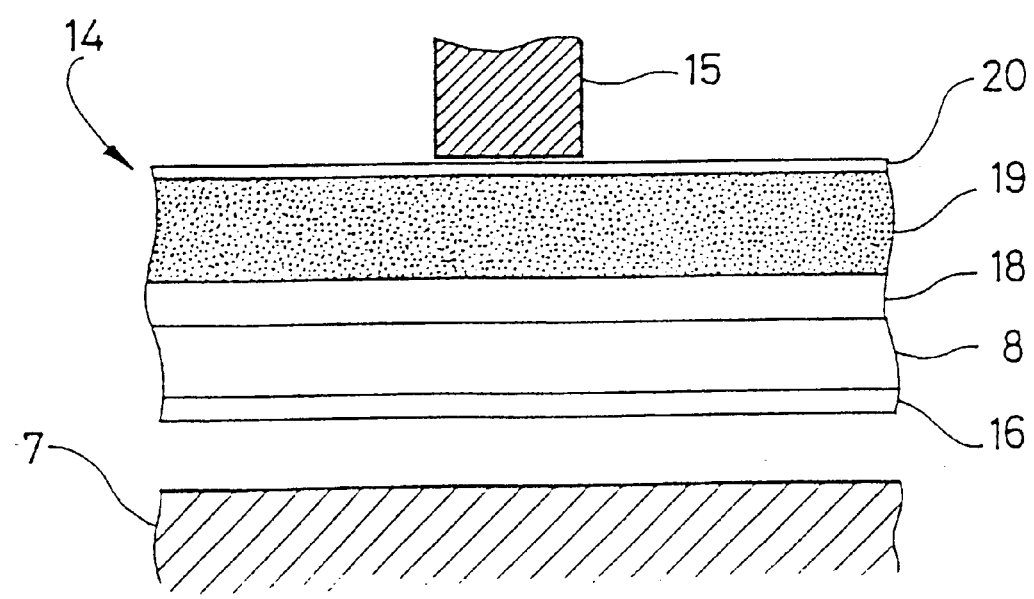
FIG. 4 illustrates, in cross-section, the transfer of a protection layer from a transfer film in accordance with a second variant implementing this first embodiment of the invention.

For this purpose, according to first embodiment of the invention shown in FIGS. 3 and 4, a transfer film 14 is applied to the surface of card body 3 and it is subjected to a heat source provided, for example, by an electronic head 15.

Transfer film 14 is made up of several superimposed layers: a lower so-called adhesion layer 16, on which lies a so-called coating layer 8 or 17, a so-called detachment layer 18, a so-called support layer 19 and a top, so-called sliding, layer intended to come into contact with electronic head 15.

In one example, adhesion layer 16 is a layer of PVC-PVAc, detachment layer 18 is a layer of PVB, support layer 19 is a layer of PET, and sliding layer 20 is a layer of alkyl polyurethane.

To produce coating layer 8, 17 of the transfer film 14, a first solution I in liquid phase is prepared. This solution I is a mixture of monomers and/or oligomers comprising alcohol functions, one or more catalysts or initiators of polymerization of said monomers or oligomers, and a solvent. This mixture may also possibly comprise difunctional compounds having, in one example, two alkene functions at either end.

The monomers and/or oligomers of solution I are able to polymerize in two consecutive, independent, and therefore controllable, stages: a first so-called polymerization stage and a second so-called post cross-linkage stage, said stages using different chemical reactions initiated by different catalysts or initiators.

According to the invention, the polymerization of the monomers or oligomers and of any difunctional compounds of solution I is activated or initiated. This polymerization uses a first radical reaction mechanism in which the monomers or oligomers polymerize to form thermoplastic polymers which may be slightly cross-linked by the difunctional compounds and comprising alcohol functions. In this way a second solution II is obtained.

To this solution II, on the alcohol functions of the polymers of solution II, are then added monomers or oligomers comprising epoxy functions and an addition cationic catalyst of said monomers or oligomers. A solution III is subsequently obtained.

This solution III is deposited on support layer 19 previously coated with the adhesive forming detachment layer 18 and possibly covered with sliding layer 20.

The solvent phase of the deposited solution III is then evaporated and film 14 shown in FIG. 3 is obtained comprising coating layer 17, a so-called transient thermoplastic coating layer, that is dry to the touch and is little or not cross-linked. This film 14 may be rolled up and stored.

The extent of cross-linkage of transient layer 17 may be pre-determined by adjusting the quantity of difunctional compounds in solution III. Also, by adjusting the distance between the two alkene functions and the difunctional compounds, a thermoplastic polymer is obtained that has little cross-linkage and whose mesh is more or less slack.

Under a first variant of implementation of the first embodiment of the invention, transient layer 17 is-transferred as such onto layer 7 of card body 3 from the transfer film 14 shown in FIG. 3.

The ability of a polymerized layer to be printed is inversely proportional to the extent of its cross-linkage. The greater the extent of cross-linkage of a polymerized layer, the less this layer is printable. Therefore a thermoplastic, and consequently little polymerized, layer is printable and, on this account, transient coating layer 17 can be printed after its transfer onto layer 7 of card body 3. For this purpose, it is possible in particular to cause dyes to be diffused under the effect of heat in or through transient layer 17 from a coloured film, not shown in the figures, which is placed on said transferred transient layer 17.

Subsequently, after possible printing, transient layer 17 is post cross-linked so as to make it thermosettable. A second reaction is then initiated through the release, in transient layer 17, of $H^+$ protons derived from a cationic catalyst. It is the addition of the compounds comprising two epoxy functions onto the alcohol functions of the polymers.

In reality, according to the invention, interpenetrated or semi-interpenetrated networks are fabricated which combine two types of successive reactions derived from different mechanisms, namely polymerization or radical cross-linkage involving peroxides or UVs, and polycondensation or cationic polymerization, the first reaction making use of double bonds and the second, whose initiation is controlled, causing epoxy groups or isocyanates to act on alcohols or amines.

The thermosettable layer 8 that is obtained, therefore comprising polymers or copolymers of monomers that are cross-linked by bonding derived from the addition of an alcohol function on an epoxy group, is, unlike transient layer 17, insensitive to temperature, abrasion and solvents. Therefore any counterfeiters wishing to denature coating layer 8 would encounter considerable difficulty. Also, the coloured printing compounds 9, contained in coating layer 8 or in layer 7, do not diffuse spontaneously in or through said layer 8 as is the case for cards belonging to the current state of the art. Consequently, even when carried in a plastic pouch of a wallet, the cards that are the subject of the present invention do not fade. Post cross-linkage therefore protects the print.

Under a second variant of implementation of the first embodiment of the invention, illustrated in FIG. 4, transient layer 17 is post cross-linked on its film support 14. To said post cross-linked, thermosetting layer 8, adhesion layer 16 is then advantageously added before its transfer onto layer 7 of card body 3.

Also, under a second embodiment of the invention, the transfer of coating layer 8 or 17 is not made from a transfer film, but layer 7 of card body 3 is directly coated with solution III. After evaporation of the solvent phase, transient coating layer 17 of the invention is obtained, which may be printed before initiating post-polymerization. Depositing solution III in liquid phase promotes wetting of layer 7 and, consequently, the adhesion of transient layer 17 on said layer 7 is considerably improved.

Finally, in a third embodiment of the invention, a solution IV is directly obtained by mixing the monomers and/or oligomers and other compounds of solution I with the monomers and/or oligomers and other compounds of solution III. Selective polymerization of the monomers and oligomers of solution I is then made by initiating solely radical polymerization, the solvent is evaporated and the polymers obtained are post-polymerized.

In one example of the invention, solution I is a mixture of:

methacrylate monomers or oligomers having alcohol functions;

azo-bis-iso-butyro nitrile (AIBN) catalyzing the polymerization of the above-mentioned monomers or oligomers methyl-ethyl-ketone solvent; and difunctional compounds comprising two double carbon-carbon bonds at chain end.

A rise in temperature, in the region of 80° C., leads to activating the AIBN which splits and releases free radicals initiating the polymerization of the methacrylate mono and oligomers. The final solution obtained is solution II.

To this solution II are added monomers or oligomers comprising two expoxy groups;

a cationic catalyst; and various monomers or oligomers such as ethyl triglycol methacrylate (ETGMA) which, in particular, provides a pliability effect through inner plastification of glycidylmethylmethacrylate (GMMA) or of hydroxyethylmethacrylate (HEMA). A solution III is obtained which, after evaporation of the solvent phase of methyl-ethyl-ketone, and post cross-linkage, enables a cross-linked coating layer 8 of the invention to be obtained.

In a further example of embodiment, two formulations were prepared from a solution of methacrylate polymers comprising 20 MMA per 5 HEMA which was mixed with a co-reagent, namely diglycidylether of butanediol-1,4 (DGEBD) for formulation 1, and 3,4 epoxycyclohexylmethyl-3,4 epoxycyclohexane (ECHME) for formulation II, and with a a 2% catalyst. Both these formulations have a -OH function derived from the methacrylate polymers by epoxy function derived from the DGEBO or ECHME co-reagents.

Also, one PET support layer was coated with a release layer made up of two sub-layers of approximately 1 μm PVB.

From 3 to 6 μm of either of formulations I or II was then deposited on the PVB layer.

The solvent of formulations I and II was subsequently evaporated for 2 minutes at 40-50° C. in a drying oven. For each formulation a transfer film was obtained such as described in FIG. 3 comprising a thermoplastic layer 17.

Layers 17 were transferred onto a PVC card comprising a photographic print, using an electronic heating head. After conducting post cross-linkage of said transferred layers, for example using UVs, two cards I and II were obtained.

Comparative tests were performed on cards I and II and on a card III of the state of the art comprising a PMMA-based thermoplastic coating layer.

These tests showed that the dyes from the photographic print on cards I and II did not migrate substantially onto a plastic wallet pouch, unlike those of card III the resistance to solvents of cards I and II, in particular resistance to xylene, was higher than that of card III. The cards provided with the coating layer 8 of the invention did not show any apparent blistering. Also, the photographic print was not denatured.

In another example of embodiment, a solution of methacrylate polymer was prepared, comprising 20 MMA and 5 HEMA with a vinylacetate, vinylalcohol, vinylchloride copolymer of VAGH type marketed by Union Carbide. After depositing on the card body and cross-linkage, tests showed that the resistance to abrasion of the card obtained was twice as high as that of card III.

The invention disclosed herein therefore provides a solution to the problems raised by the state of the art. It will be noted, however, that it is in no way restricted to cross-linkage of polymethacrylates comprising hydroxyl functions with difunctional compounds comprising two epoxide functions. Obviously, any process which makes use of a thermoplastic layer able to be post cross-linked comes under the invention.

What is claimed is:

1. Process for fabricating a card support (1) comprising a support body (3) including, on one of its faces (4) a thermosettable coating layer (8) characterized in that, for the manufacture of said coating layer (8), one proceeds in two consecutive independent stages:

in the first stage monomers and/or oligomers are polymerized by radical polymerization to form a transient thermoplastic layer (17) which is applied on face (4) of support body (3), and in the second stage monomers and/or oligomers are polymerized by cationic addition polymerization in contact with said transient thermoplastic layer (17) to cross-link said layer (17) thereby providing said thermosettable coating layer (8).

2. Process according to claim 1 characterized in that in order to obtain said transient thermoplastic layer (17):

one prepares a first solution (I) in a liquid phase having a mixture of monomers and/or oligomers and a catalyst or an initiator of radical polymerization of said monomers and/or oligomers, and one initiates the polymerization of said monomers and/or oligomers of said solution (I) in order to obtain a second solution (II).

3. Process according to claim 2 characterized in that, one introduces into said second solution (II) monomers and/or oligomers and a catalyst of the cationic addition polymerization of said monomers and/or oligomers on the polymers of said second solution (II) in order to obtain a third solution (III).

4. Process according to claim 3 characterized in that one coats a layer (7) of said support body (3) with said third solution (III).

5. Process according to claim 3 characterized in that one deposits said third solution (III) on a layer (19) of a transfer film (14).

6. Process according to claim 5 characterized in that one evaporates a solvent phase of said third solution (III).

7. Process according to claim 5 characterized in that one transfers said transient thermoplastic layer (17) onto said body of the support (3) from transfer film (14).

8. Process according to claim 7 characterized in that one cross-links said transient thermoplastic layer (17) before its transfer.

9. Process according to claim 1 characterized in that one prints said transient thermoplastic layer (17).

10. Process according to claim 1 characterized in that for the making of said coating layer (8) one cross-links methacrylic polymers by the constituent compositions which are epoxy groups and alcohol functions.

11. Process in accordance with claim 1 wherein monomers and/or oligomers of the first stage comprise alcohol functions and monomers and/or oligomers of the second stage comprise epoxy functions.

12. Process for fabricating a card support (1) comprising a support body (3) with a coating layer (8) on one of its sides (4) characterized in that to fabricate the coating layer (8) a transient thermoplastic layer (17) is cross-linked so as to make it thermosettable, comprising the steps of:

preparing a first solution (I) in liquid phase comprising a mixture of monomers and/or oligomers and a polymerization catalyst or initiator of said monomers and/or oligomers, preparing a second solution (II) by activating the polymerization of the monomers and/or oligomers of said first solution (I) in order to thus obtain said second solution (II), preparing a third solution (III) from said second solution by adding to the second solution (II) monomers and/or oligomers an addition cationic catalyst of said monomers and/or oligomers in order to obtain said third solution (III), depositing or evaporating the third solution (III) on a layer (19) of a transfer film (14), or coating a support body (3) with the third solution (III), to form transient thermoplastic layer (17)

wherein in order to obtain coating layer (8), there are two consecutive independent stages, a first polymerization stage involving a radical mechanism in which monomers and/or oligomers polymerize to form a transient thermoplastic layer (17), and a second stage in which the transient thermoplastic layer (17) is cross-linked so as to form the thermosettable coating layer (8).

13. Process in accordance with claim 12 characterized in that the transient thermoplastic layer (17) is transferred onto the support body (3) from a transfer film (14).

14. Process in accordance with claim 13 wherein the transient thermoplastic layer (17) is cross-linked prior to its transfer.

15. Process in accordance with claim 12 wherein methacrylic polymers are cross-linked by compounds comprising either epoxy groups or alcohol functions.

16. Process in accordance with claim 12 characterized in that, a solvent phase of the third solution (III) is evaporated.

17. Process in accordance with claim 12, characterized in that, the transient thermoplastic layer (17) is printed.

18. Process in accordance with claim 12 characterized in that, the monomers and/or oligomers of said first solution (I) comprise alcohol functions.

19. Process in accordance with claim 18, characterized in that, said solution (I) also comprises difunctional compounds.

20. Process in accordance with claim 19, characterized in that, said difunctional compounds comprise two alkene functions.

21. Process in accordance with claim 18, characterized in that, to said solution (II) are added monomers and/or oligomers comprising epoxy functions and an addition cationic catalyst of said monomers and/or oligomers in order to obtain a third solution (III).

22. Process according to claim 12 comprising the step of inserting printed material between the card (3) and the coating layer (8) prior to the cross linking of said coating layer.

23. Process for fabricating a card support (1) comprising a support body (3) with a coating layer (8) on one of its sides (4) characterized in that to fabricate the coating layer (8) a transient thermoplastic layer (17) is cross-linked so as to make it thermosettable, comprising the steps of:

preparing a solution of (a) monomers and/or oligomers comprising alcohol functions and a polymerization catalyst or initiator of said monomers and/or oligomers, and (b) monomers and/or oligomers comprising epoxy functions and an addition cationic catalyst of said monomers and/or oligomers;

effecting radical polymerization of said monomers and/or oligomers comprising alcohol functions to form a transient thermoplastic layer (17); and effecting cationic addition polymerization of said monomers and/or oligomers comprising epoxy functions to cross-link said transient thermoplastic layer (17) thus providing a thermosettable coating layer.

24. A process comprising the steps of (a) selecting a plastic card 85 mm long, 54 mm wide and less than 0.76 mm thick, and having upper and lower major faces (6,7), (b) choosing a support layer (19), (c) applying a detachment layer (18) to one major face of said support layer, (d) preparing a first solution (I) in liquid phase comprising a mixture of monomers and/or oligomers and a polymerization catalyst or initiator of said monomers and/or oligomers, (e) preparing a second solution (II) by activating the polymerization of the monomers and/or oligomers of said first solution (I) in order to thus obtain said second solution (II), (f) preparing a third solution (III) from said second solution by adding to the second solution (II) monomers and/or oligomers an addition cationic catalyst of said monomers and/or oligomers in order to thus obtain said third solution (III), (g) depositing said third solution III onto another major face of the detachment layer, (h) evaporating the deposited third solution to form a transient-thermoplastic coating layer (17) involving a mechanism in which the monomers and/or oligomers polymerize to form said transient thermoplastic layer, (i) inserting printing on said coating layer or on the upper face of the card, (j) joining said coating layer to said upper face of said card with said printing therebetween and post-cross-linking the transient-thermoplastic layer so as to form a thermosettable layer (8), (k) removing said detachment layer and said support layer, (l) the thickness of said card and thermosettable layers being a total of 0.76 mm.

25. The method of claim 24 wherein in said step (j) said post-cross-linking is made before said joining.

26. A process comprising the steps of selecting a plastic card 85 mm long, 54 mm wide and less than 0.76 mm thick, and having upper and lower major faces (6,7), preparing a first solution (I) in liquid phase comprising a mixture of monomers and/or oligomers and a polymerization catalyst or initiator of said monomers and/or oligomers, preparing a second solution (II) by activating the polymerization of the monomers and/or oligomers of said first solution (I) in order to thus obtain said second solution (II), preparing a third solution (III) from said second solution by adding to the second solution (II) monomers and/or oligomers an addition cationic catalyst of said mono mers and/or oligomers in order to thus obtain said third solution (III), depositing said third solution III onto one major face of the card, evaporating the deposited third solution to form a transient-thermoplastic coating layer (17) involving a mechanism in which the monomers and/or oligomers polymerize to form said transient-thermoplastic layer, inserting printing on said coating layer or on the upper face of the card, post-cross-linking the transient-thermoplastic layer so as to form a thermosettable layer (8), the thickness of said card and thermosettable layer being a total of 0.76 mm.

* * * * *